United States Patent
Kashiwakura (10) Patent No.: US 8,847,641 B2
(45) Date of Patent: Sep. 30, 2014

(54) PHASE COMPARISON DEVICE AND DLL CIRCUIT

(75) Inventor: Shoichiro Kashiwakura, Chiba (JP)

(73) Assignee: MegaChips Corporation, Osaka-shi (JP)

(*) Notice: Subject to any disclaimer, the term of this patent is extended or adjusted under 35 U.S.C. 154(b) by 0 days.

(21) Appl. No.: 14/232,371

(22) PCT Filed: Jul. 17, 2012

(86) PCT No.: PCT/JP2012/068056
§ 371 (c)(1),
(2), (4) Date: Jan. 13, 2014

(87) PCT Pub. No.: WO2013/011972
PCT Pub. Date: Jan. 24, 2013

(65) Prior Publication Data
US 2014/0167820 A1    Jun. 19, 2014

(30) Foreign Application Priority Data
Jul. 19, 2011    (JP) .................................. 2011-157923

(51) Int. Cl.
*H03L 7/06*    (2006.01)
*H03D 13/00*    (2006.01)
*H03L 7/085*    (2006.01)

(52) U.S. Cl.
CPC .............. *H03L 7/085* (2013.01); *H03D 13/00* (2013.01)
USPC ........... 327/149; 327/146; 327/147; 327/150; 327/153; 327/158

(58) Field of Classification Search
CPC ......... H03L 7/0891; H03L 7/095; H03L 7/08; H03L 7/00
USPC ............. 327/2, 3, 5, 146, 147, 149, 150, 151, 327/153, 156, 158, 159, 161
See application file for complete search history.

(56) References Cited

U.S. PATENT DOCUMENTS 6,587,811 B2 * 7/2003 Schleifer et al. .............. 702/176
8,392,744 B2 * 3/2013 Lin ............................... 713/500
(Continued)

FOREIGN PATENT DOCUMENTS

| | | |
|---|---|---|
| JP | 53 64570 | 6/1978 |
| JP | 2 141121 | 5/1990 |

OTHER PUBLICATIONS

Hogge, C. R., "A Self Correcting Clock Recovery Circuit", Journal of Lightwave Technology, vol. LT-3, No. 6, pp. 1312-1314, (Dec. 6, 1985).

(Continued)

*Primary Examiner* — Lincoln Donovan
*Assistant Examiner* — Jung H Kim
(74) *Attorney, Agent, or Firm* — Oblon, Spivak, McClelland, Maier & Neustadt, L.L.P.

(57) ABSTRACT

A phase detection range is enabled to be expanded to an arbitrary number of times of a cycle of a reference clock, and in the case of application to a DLL circuit, an operation cycle is enabled to be freely selected. A phase comparison device includes a divider that generates a division clock obtained by receiving a reference clock and dividing it by two; an inverter that inverts a phase of the division clock to generate a division inverted clock; a DFF circuit that synchronizes the division inverted clock with a delay clock to generate a synchronized clock; a DFF circuit that synchronizes the clock with the feedback clock to generate a final synchronized clock; and a phase comparator that receives the division clock and the final synchronized clock to compare phases of the division clock and the final synchronized clock.

7 Claims, 9 Drawing Sheets

(56) References Cited

U.S. PATENT DOCUMENTS

2004/0100312 A1* 5/2004 Cho .............................. 327/158
2006/0097762 A1* 5/2006 Jeon .............................. 327/156

OTHER PUBLICATIONS

Alexander, J.D.H., "Clock Recovery From Random Binary Signals", Electronic Letters, vol. 11, No. 22, pp. 541-542, (Oct. 30, 1975).

International Search Report Issued Oct. 9, 2012 in PCT/JP12/068056 Filed Jul. 17, 2012.

International Preliminary Report on Patentability and Written Opinion issued Jan. 30, 2014, in International Application No. PCT/JP2012/068056 (with English translation).

* cited by examiner

PHASE COMPARISON DEVICE AND DLL CIRCUIT

TECHNICAL FIELD

The present invention relates to a phase comparison device for making a comparison between the phase of two clocks, and a DLL circuit using the phase comparison device.

BACKGROUND ART

In clock generation circuits such as a CDR circuit and a DLL circuit, a phase comparator has been broadly used for making phase comparison between input data and a clock. As typical phase comparators well known are: a Hogge type which outputs a linear signal in accordance with a phase difference between two input signals (see Non-patent Document 1); and an Alexander type which just determines whether one input signal is advanced or delayed with respect to the other input signal, and outputs a binary signal (see Non-patent Document 2).

Figure 9:
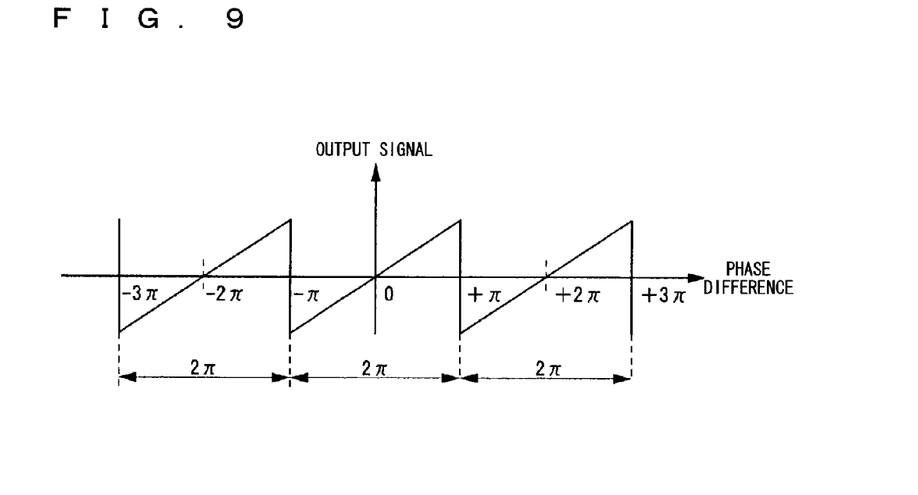
FIG. 9 is an operation characteristic diagram of a normal phase comparator.

In the linear phase comparator typified by the Hogge type, for example as shown in FIG. 9, an output signal, whose value linearly changes in proportion to a phase difference between two input signals, is obtained. A phase detection range is generally a range from $-\pi$ to $+\pi$, and the phase detection range characteristically returns in a $2\pi$ cycle.

Figure 10:
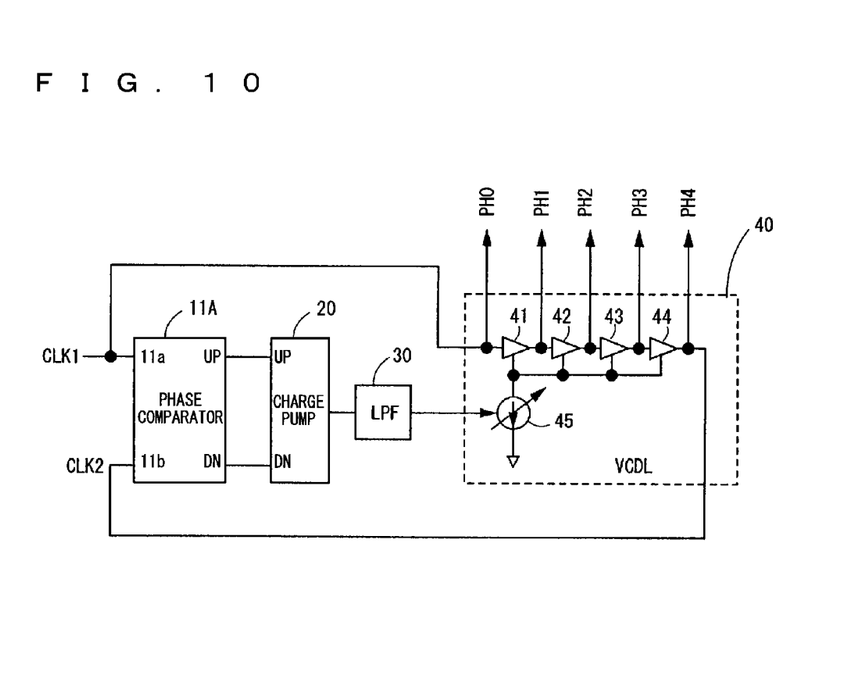
FIG. 10 is a circuit diagram of a conventional DLL circuit.

FIG. 10 is a constitutional diagram of a case where the phase comparator is used for a DLL circuit. This DLL circuit has a closed loop made up of a linear phase comparator 11A, a charge pump 20, a low-pass filter 30, and a variable delay buffer (VCDL) circuit 40. A negative feedback is then applied such that a phase of a rising edge of a reference clock CLK1 inputted from the outside matches a phase of a rising edge of a feedback clock CLK2 outputted from the variable delay buffer circuit 40, namely the feedback clock CLK2 comes into the state of being delayed from the reference clock CLK1 just by one cycle ($2\pi$).

The variable delay buffer circuit 40 includes cascade-connected four-stage delay elements 41, 42, 43, 44 with same characteristics, and a common current source 45 for supplying an operating current to each of the delay elements 41 to 44. The current of the current source 45 is increased or decreased by means of an output signal of the low-pass filter 30, thereby to mutually control a delay amount of each of the delay elements 41 to 44. When the feedback clock CLK2 is delayed just by one cycle and the DLL circuit is locked, a delay clock PH1 delayed from the reference clock CLK1 just by ¼ cycle is obtained from the delay element 41 of the variable delay buffer circuit 40, a delay clock PH2 delayed just by 2/4 cycle is obtained from the delay element 42, and a delay clock PH3 delayed just by ¾ cycle is obtained from the delay element 43. A clock PH0 is the same clock as the reference clock CLK1, and a clock PH4 is the same clock as the feedback clock CLK2.

PRIOR ART DOCUMENT

Non-Patent Document

Non-patent Document 1: C. R. Hogge, "A self correcting clock recovery circuit", J. Lightwave Technol., vol. LT-3, pp. 1312-1314, December 1985

Non-patent Document 2: J. D. H. Alexander, "Clock recovery from random binary signals", Electron. Lett., vol. 11, no. 22, pp. 541-542, October 1975

SUMMARY OF THE INVENTION

Problems to be Solved by the Invention

In the phase comparator 11A as described above, a phase detection range of the reference clock CLK1 and the feedback clock CLK2, namely a pulling range as the DLL circuit, is from $+\pi$ to $-\pi$. Unless the delay amount of the variable delay buffer circuit 40 is held within this pulling range, the circuit is not operated as the DLL circuit. This variable delay buffer circuit 40 should at least have the minimum delay amount corresponding to $\pi$ of the reference clock CLK1 in order to satisfy the restriction of $-\pi$ of the pulling range. This needs to be elaborated as an absolute minimum delay amount in terms of hardware.

Figure 11:
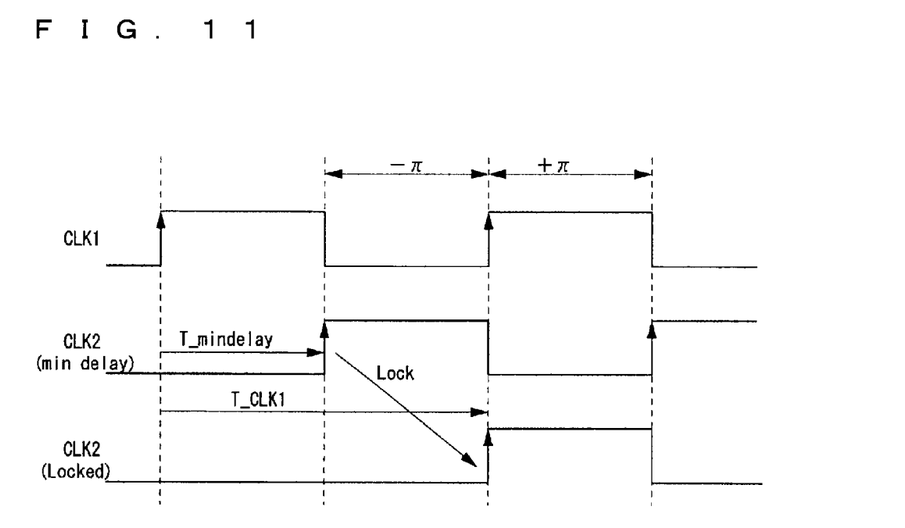
FIG. 11 is an explanatory diagram of the absolute minimum delay amount of a variable delay buffer circuit.

As shown in FIG. 11, when this absolute minimum delay amount T_mindelay matches $\pi$ (a half of the cycle of the reference clock CLK1), the delay amount of the variable delay buffer circuit 40 gradually increases and the DLL circuit is locked until the delay of the variable delay buffer circuit 40 matches the cycle of the reference clock CLK1. At this time, a restriction as shown in the following expression (1) is given to the relation between a cycle T_CLK1 of the reference clock CLK1 and the absolute minimum delay amount T_mindelay of the variable delay buffer circuit 40:

$$T\_CLK1 \leq 2 \times T\_\text{mindelay} \quad (1)$$

Figure 12:
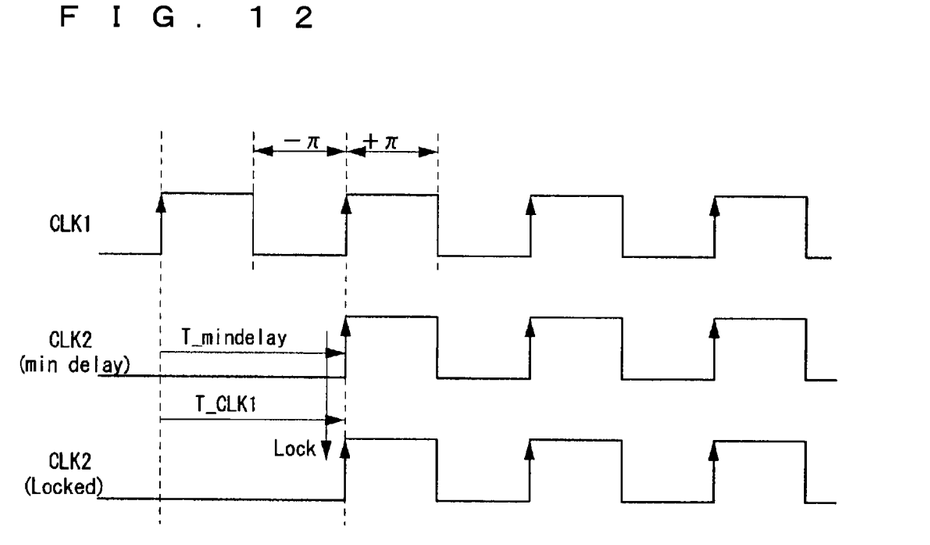
FIG. 12 is an explanatory diagram of the absolute minimum delay amount of the variable delay buffer circuit.

On the other hand, as shown in FIG. 12, the DLL circuit is in the locked state when the cycle of the reference clock CLK1 is short and the absolute minimum delay amount T_mindelay of the variable delay buffer circuit 40 matches the cycle of the reference clock CLK1. Further, since the delay of the variable delay buffer circuit 40 can no longer be made shorter, the following restriction is similarly given:

$$T\_CLK1 \geq T\_\text{mindelay} \quad (2)$$

As thus described, the absolute minimum delay amount T_mindelay is required for the variable delay buffer circuit 40, and the following conditional expression is given from the above expressions (1) and (2).

$$T\_\text{mindelay} \leq T\_CKL1 \leq 2 \times T\_\text{mindelay} \quad (3)$$

That is, when the DLL circuit is intended to be configured in accordance with the present configuration, the phase detection range of the reference clock CLK1 is restricted to a range which is double the absolute minimum delay amount T_mindelay. There has thus been a problem of not being able to constitute a wide-band DLL exceeding the double range.

An object of the present invention is to provide a phase comparison device which enables a phase detection range to be expanded. Moreover, the object is also to provide a DLL circuit which is applied with such a phase comparison device so as to enable its operation cycle to be freely selected.

Means for Solving the Problems

In order to achieve the above object, a phase comparison device according to claim 1 is a phase comparison device which compares a first clock with a second clock having the same frequency as the first clock and delayed from the first clock just by a delay amount D1, the phase comparison device including: a divider that generates a division clock obtained by receiving the first clock and dividing the clock by N (N is a positive integer not smaller than two); an inverter that inverts a phase of the division clock to generate a division inverted clock; first synchronizing section for synchronizing the division inverted clock sequentially with delay clocks in the number of m (m is a positive integer not smaller than N−1) to generate a synchronized clock, the delay clocks having the same frequencies as the first clock and whose delay amounts from the first clock increase by $2\pi$ each at the maximum within a range smaller than the delay amount D1 when one cycle of the first clock is regarded as $2\pi$; second synchronizing section for synchronizing the synchronized clock with the second clock to generate a final synchronized clock; and a phase comparator that receives the division clock and the final synchronized clock to compare phases of the division clock and the final synchronized clock.

In the phase comparison device according to claim 1, an invention according to claim 2 is characterized in that the phase comparator compares phases of rising edges of the division clock and the final synchronized clock and the division clock has an "L" period of $2\pi$ and an "H" period of $2(N-1)\pi$, or the phase comparator compares phases of falling edges of the division clock and the final synchronized clock and the division clock has an "H" period of $2\pi$ and an "L" period of $2(N-1)\pi$.

In the phase comparison device according to claim 1 or 2, an invention according to claim 3 is characterized in that N=2 and m=1, and the first synchronizing section generates the synchronized clock by use of the delay clock whose delay amount from the first clock is D2 ($0<D2<2\pi$ and $D1-2\pi<D2$).

In the phase comparison device according to claim 3, an invention according to claim 4 is characterized in that the delay amount D2 of the delay clock is 0.5D1.

A DLL circuit according to claim 5 includes: the phase comparison device according to any one of claims 1 to 4; and a variable delay buffer circuit that delays the first clock just by a delay amount controlled based upon a phase comparison result of the phase comparator, and outputs the clock as the second clock.

In the DLL circuit according to claim 5, an invention according to claim 6 is characterized in that the variable delay buffer circuit includes a plurality of delay buffers that are cascade-connected and whose delay amounts are mutually controlled based upon the result of the phase comparator; and the delay clocks in the number of m are clocks taken out from the respective output sides of the plurality of different delay buffers.

In the DLL circuit according to claim 5 or 6, an invention according to claim 7 is characterized in that the phase comparator outputs the phase comparison result which maintains the delay amount of the variable delay buffer circuit when $D1=2\pi$.

Effects of the Invention

According to a phase comparison device of the present invention, a phase detection range can be extended beyond a range of $-\pi$ to $+\pi$. Further, in the case of application to a DLL circuit, its operation cycle can be freely selected, to enable realization of a wide-band DLL circuit.

DESCRIPTION OF EMBODIMENTS

First Embodiment

Figure 1:
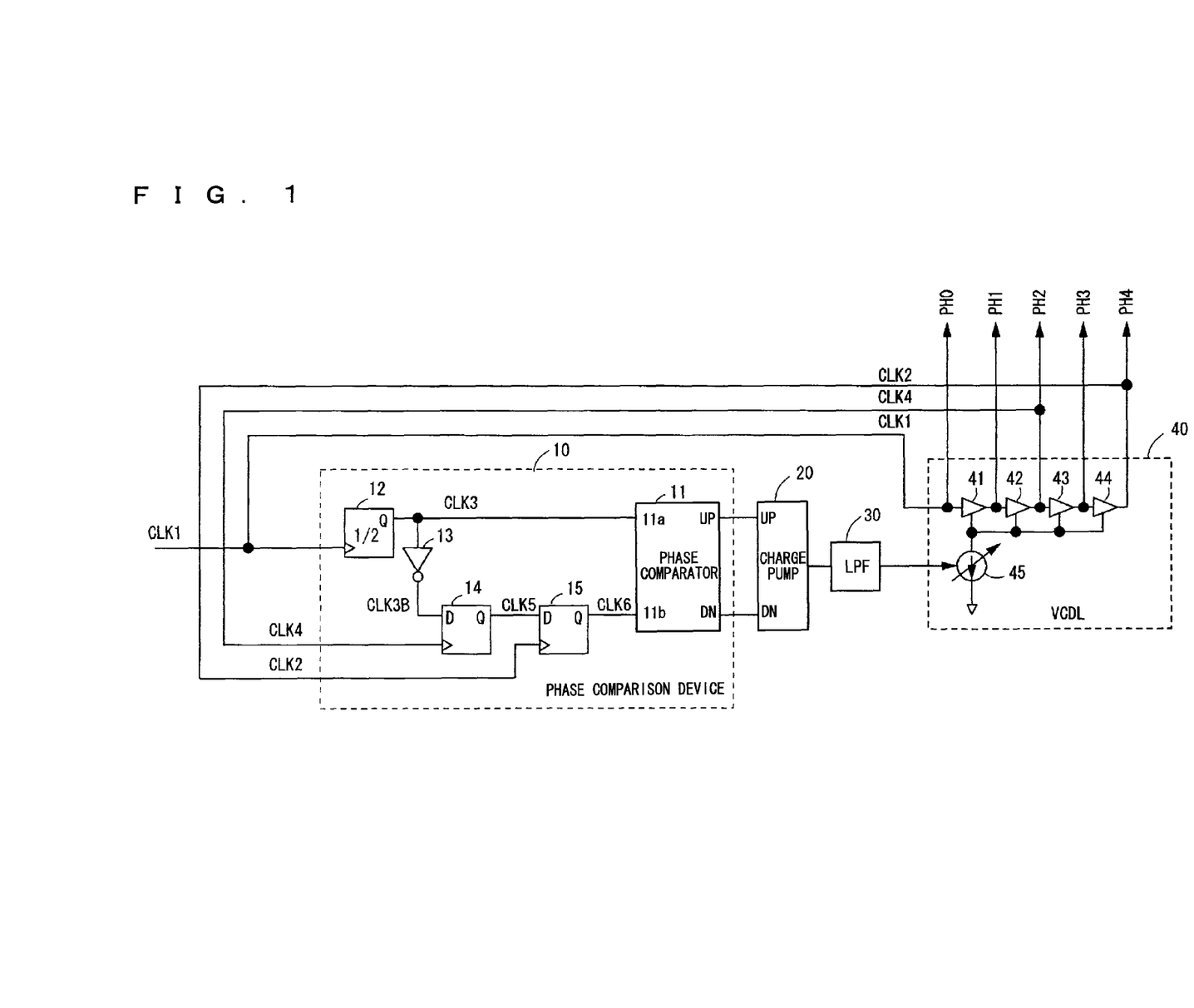
FIG. 1 is a circuit diagram of a DLL circuit in a first embodiment of the present invention.

FIG. 1 shows a DLL circuit including a phase comparison device 10 of a first embodiment. The same one as shown in FIG. 10 is provided with the same sign. In the DLL circuit of the present embodiment, the phase comparator 11A described in FIG. 10 is replaced by the phase comparison device 10.

This phase comparison device 10 includes: a divider 12 including a TFF circuit to divide a reference clock CLK1 by two (double cycle); an inverter 13 that inverts a phase of a division clock CLK3 outputted from the divider 12 to generate a division inverted clock CLK3B; a DFF circuit 14 that synchronizes the division inverted clock CLK3B outputted from the inverter 13 with a delay clock PH2 (=CKL4) outputted from a delay element 42 of the variable delay buffer circuit 40; a DFF circuit 15 that finally synchronizes a synchronized clock CLK5 outputted from the DFF circuit 14 with a feedback clock CLK2; and a phase comparator 11 in which the division clock CLK3 is inputted into a reference signal input terminal 11a and a final synchronized clock CLK6 finally synchronized in the DFF circuit 15 is inputted into a feedback signal input terminal 11b. This phase comparator 11 is one having the same configuration as that of the phase comparator 11A described in FIG. 10, and its phase detection range is a range of $-\pi$ to $+\pi$ when a frequency of a clock that is to be inputted into the input terminal is regarded as $2\pi$.

Hence in the present embodiment, since the division clock CLK3 obtained by dividing the reference clock CLK1 by two is defined as an input of the phase comparator 11, when the reference clock CLK1 is regarded as a reference, the phase detection range exceeds the range of $-\pi$ to $+\pi$ to be extended to a range of $-2\pi$ to $+2\pi$. In addition, as for the relation with the claims, the DFF circuit 14 constitutes the first synchronizing means and the DFF circuit 15 constitutes the second synchronizing means.

In the present embodiment, since the clock that is to be inputted into the input terminal 11a of the phase comparator 11 is the division clock CLK3, the feedback clock CLK2 also needs to be divided and then inputted into the input terminal 11b. However, dividing the feedback clock CLK2 and inputting it into the phase comparator 11 requires two dividers, respectively for the reference clock and the feedback clock. When a combined state of the two dividers is considered, there exist two states of the phase relation, that is, a proper state and a shifted state just by $\pi$, and wrong locking may be performed. Further, complex control in consideration of a jitter between the two dividers and the like is also required.

Hence in the present embodiment, in order to perform phase comparison in a state where the phase relation between the feedback clock CLK2 and the division clock CLK3 is properly held, the division clock CLK3 is synchronized with the feedback clock CLK2, to generate the final synchronized clock CLK6 and input it into the phase comparator 11. That is, in the phase comparison, erroneous detection of the phase relation is prevented by use of the final synchronized clock CLK6 generated from one division clock CLK3.

The division inverted clock CLK3B of the division clock CLK3 is synchronized with the delay clock CLK4 outputted from the delay element 42 of the variable delay buffer circuit 40, to become the synchronized clock CLK5. It is further synchronized with the feedback clock CLK2 again, to be the final synchronized clock CLK6, which is then inputted into the feedback signal input terminal 11b of the phase comparator 11. By synchronizing the division inverted clock CLK3B of the division clock CLK3 with the delay clock CLK4 as thus described, the phase comparison can be performed in a cycle behind one clock from a rise of the division clock CLK3 while phase information of the division clock CLK3 is held. The division clock CLK3 is outputted in synchronization with the rise of the reference clock CLK1. Similarly, the final synchronized clock CLK6 is outputted in synchronization with the rise of the feedback clock CLK2. That is, phase information of the reference clock CLK1 and the feedback clock CLK2 as the original clocks are transmitted to the division clock CLK3 and the final synchronized clock CLK6. For this reason, a phase comparison result for the division clock CLK3 and the final synchronized clock CLK6 matches a phase comparison result for the reference clock CLK1 and the feedback clock CLK2, to enable phase adjustment with the same accuracy as that of the conventional phase comparator 11.

Figure 2:
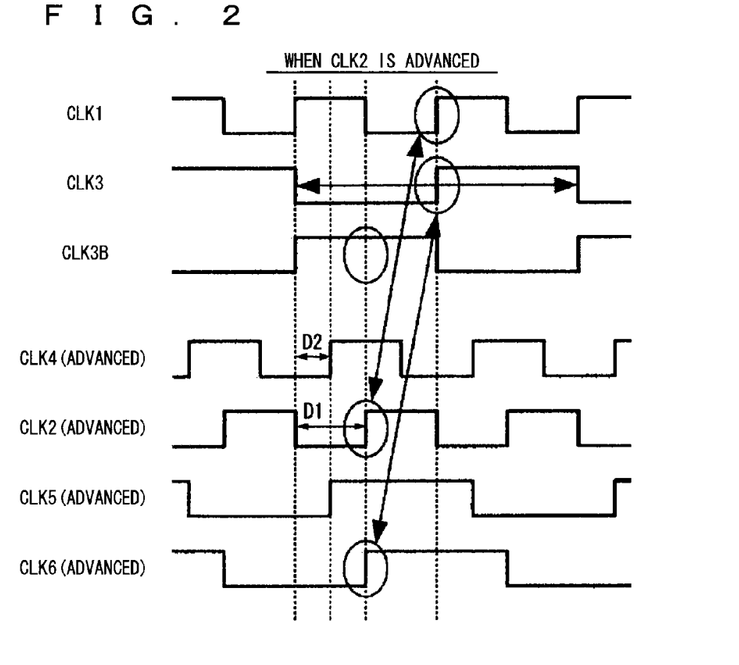
FIG. 2 is an operation waveform diagram at the time when a phase of a feedback clock CLK2 is advanced with respect to that of a reference clock CLK1 in the DLL circuit of FIG. 1.
Figure 3:
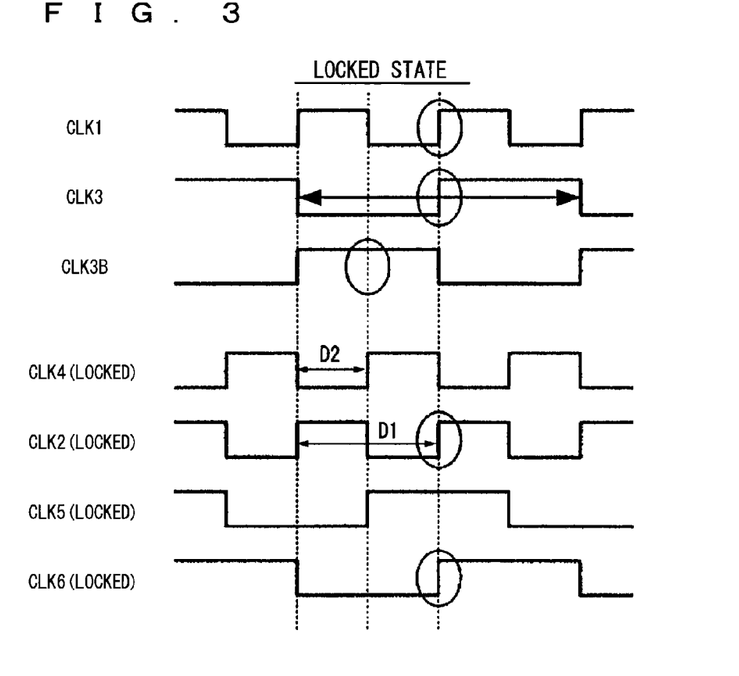
FIG. 3 is an operation waveform diagram at the time when the phase of the feedback clock CLK2 is the same as that of the reference clock CLK1 in the DLL circuit of FIG. 1.
Figure 4:
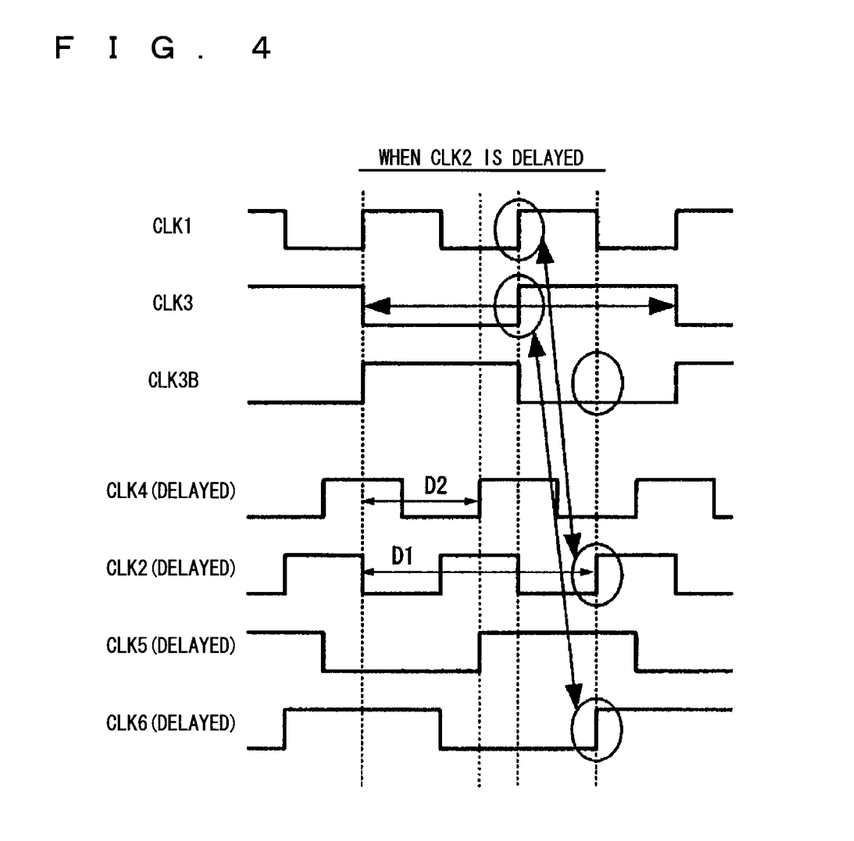
FIG. 4 is an operation waveform diagram at the time when the phase of the feedback clock CLK2 is delayed with respect to that of the reference clock CLK1 in the DLL circuit of FIG. 1.

FIGS. 2 to 4 show operation waveforms. FIG. 2 is an example of a case where a phase of the feedback clock CLK2 is advanced with respect to a locked state, FIG. 3 is the locked state where phases match, and FIG. 4 is an example of a case where the phase of the feedback clock CLK2 is delayed.

Here, the relation between a rising edge of the delay clock CLK4 and a state of the division clock CLK3 will be considered. In the case of FIG. 2 where the feedback clock CLK2 is advanced, the phase of the feedback clock CLK2 is between $-2\pi$ and 0 with the locked state being regarded as 0. For this reason, a value of the division clock CLK3 at the rising time of the feedback clock CLK2 is "L". On the other hand, in the case of FIG. 4 where the feedback clock CLK2 is delayed, the phase of the feedback clock CLK2 is between 0 and $+2\pi$ with the locked state being regarded as 0. For this reason, the value of the division clock CLK3 at the rising time of the feedback clock CLK2 is "H". For proper detection of the phase of the final synchronized clock CLK6 that is to be inputted into the input terminal 11b of the phase comparator 11, "H" should be detected in the same manner as, namely the rise should appear in the clock CLK6, in FIGS. 2 and 4. If the rise does not appear in the clock CLK6 in FIG. 4 and the division clock CLK3 is directly synchronized with the rising edge of the feedback clock CLK2, an erroneous operation may be triggered.

Hence in the present embodiment, the division inverted clock CLK3B is synchronized by use of the delay clock CLK4 at an intermediate node of the variable delay buffer circuit 40, to obtain the clock CLK5. This is again synchronized with the feedback clock CLK2 to be the final synchronized clock CLK6, thereby preventing the logical inconsistency as described above. An "H" period of the reference clock CLK1 is a half of the "H" period of the division clock CLK3, as shown in FIGS. 2 to 4 in the present embodiment. For this reason, the delay clock CLK4 may be used in order to sample "H" of the division inverted clock CLK3B.

It is to be noted that in the present embodiment, only a clock CLK3 is synchronized in a one-stage configuration by use of the clock CLK3 by division by two. However, it goes without saying that a similar function can also be realized by realizing—division by two by means of a multiple configuration with a method of using delay clocks PH1, PH3. That is, although the delay clocks (PH2) are used in the number of (the number of division−1) clocks in FIG. 1, the configuration may be formed using them in the number larger than the number of (the number of division−1). Further, the range that can be taken by each stage of the delay clock is not necessarily made equal, and the range that can be taken by each stage may be freely set. Even in that case, a condition to be set is that the range of the phase that can be taken per stage of the delay clock is constantly smaller than $2\pi$.

Further, in the present embodiment, the delay clock CLK4 (=PH2) taken out from the output side of the delay element 42 of the variable delay buffer circuit 40 has been used as described above. This has led to extension of the phase detection range of the feedback clock CLK2 to the range of $-2\pi$ to $+2\pi$. However, this is not restrictive, and it is possible to use a delay clock whose delay amount from the reference clock CLK1 is smaller than the delay amount of the feedback clock CLK2 and has an edge between the edge of the reference clock CLK1 and the edge of the feedback clock CLK2. It is thereby possible to obtain at least a phase detection range beyond the conventional range of $-\pi$ to $+\pi$. Hereinafter, the range of the delay amount of the delay clock which is useful for expanding the phase detection range will be considered.

When the delay amount of the delay clock CLK4 from the reference clock CLK1 is regarded as D2, first, it is found by referencing FIG. 2 that in the case of $0<D2<2\pi$, "H" of the division inverted clock CLK3B is sampled with CLK4 and the synchronized clock CLK5 can thus be generated. Here, in the case of FIG. 2, the delay amount (written as D1) of the feedback clock CLK2 from the reference clock CLK1 is smaller than $2\pi$ being in the locked state, and hence the condition of $0<D2<2\pi$ is satisfied when $0<D2<D1$.

In the case of FIG. 3 in the locked state, and also in FIG. 4 where $2\pi<D1$, similarly, the synchronized clock CLK5 can be generated when $0<D2<2\pi$. However, it is only in the case of $D1<(D2+2\pi)$, namely $(D1-2\pi)<D2$, that "H" of the synchronized clock CLK5 is sampled with the feedback clock CLK2 to enable generation of the final synchronized clock CLK6. It is assumed here that the "H" period of the synchronized clock CLK5 is just $2\pi$.

Here, with $D2=kD1$ ($0<k<1$), it is only in the case of $k>0.5$ that $(D1-2\pi)<D2$ can be satisfied in the range of $D1=0$ to $4\pi$ (which is the range of $-2\pi$ to $+2\pi$ when $D1=2\pi$ being in the locked state is regarded as a reference). However, when $k>0.5$ and $D1=4\pi$, the condition of $D2<2\pi$ cannot be satisfied. As thus described, in the present embodiment, strictly speaking, the phase detection range of $-2\pi$ to $+2\pi$ cannot be taken. However, when $k=0.5$, the phase detection range of nearly $2\pi$ to $+2\pi$ is taken.

Further, it is only in the case of $(1/3)<k<(2/3)$ that $(D1-2\pi)<D2$ can be satisfied in the range of $D1=0$ to $3\pi$ (which is the range of $-2\pi$ to $+\pi$ when $D1=2\pi$ being in the locked state is regarded as a reference, namely the range equivalent to or wider than the conventional one on the + side).

The above is summarized as follows.

(A) Conditions for having the phase detection range before/after the locked state:

$0<D2<2\pi$, and $D2<D1$, and $(D1-2\pi)<D2$ (B) Conditions for having the phase detection range equivalent to or wider than the conventional one on the + side (A) and $(1/3)D1<D2<(2/3)D1$ (C) Conditions for having the phase detection range of nearly $-2\pi$ to $+2\pi$ (A) and $D2=0.5D1$ Further, it is also possible to generate a delay clock that satisfies any of these desired conditions outside the DLL circuit. Moreover, in the present embodiment, the synchronization has been performed using the phase comparator 11 that compares the phases of the rising edges of the two clocks that are to be inputted into the input terminals 11a, 11b, while using the DFF circuits 14, 15 that perform sampling with the rising edge of the clock signal that is to be inputted into the clock terminal. However, it is also possible to use a phase comparator that compares phases of falling edges, and also possible to perform synchronization in a DFF that performs sampling with a falling edge of a clock signal.

It is to be noted that even in the case of making design so as to satisfy the above conditions, a desired phase detection range may not be obtained due to diverse variations. Therefore, in order to increase the operation margin, it is also possible to form a configuration where synchronization is performed with more stages. That is, in the configuration of FIG. 1, the division inverted clock CLK3B has been synchronized using only one delay clock CLK4. This synchronization of the division inverted clock CLK3B can also be performed by sequential synchronization with a plurality of delay clocks that sequentially increase by $2\pi$ each at the maximum. Also in this case, delay amounts of the plurality of delay clocks are set in the range of smaller than D1. That is, the delay amount of the delay clock to be used for final synchronization to generate the synchronized clock CLK5 is smaller than D1.

The range of the delay time possible for each of the plurality of delay clocks varies in accordance with the number of delay clocks and a required phase detection range. However, the range can be specified by performing a similar consideration to the above consideration regarding the case where the number of delay clocks is one. Alternatively, a plurality of delay clocks can also be generated by simple schematic division between the reference clock CLK1 and the feedback clock CLK2 into equal parts.

For example, when a delay amount of a first delay clock from the reference clock CLK1 is D21 and a delay amount of a second delay clock from the reference clock CLK1 is D22, it is possible that $D21=(1/3)D1$ and $D22=(2/3)D1$. In this case, with the locked state regarded as a reference, it is possible to obtain a phase detection range to $2\pi$ on the − side and beyond $2\pi$ on the + side.

Second Embodiment

Figure 5:
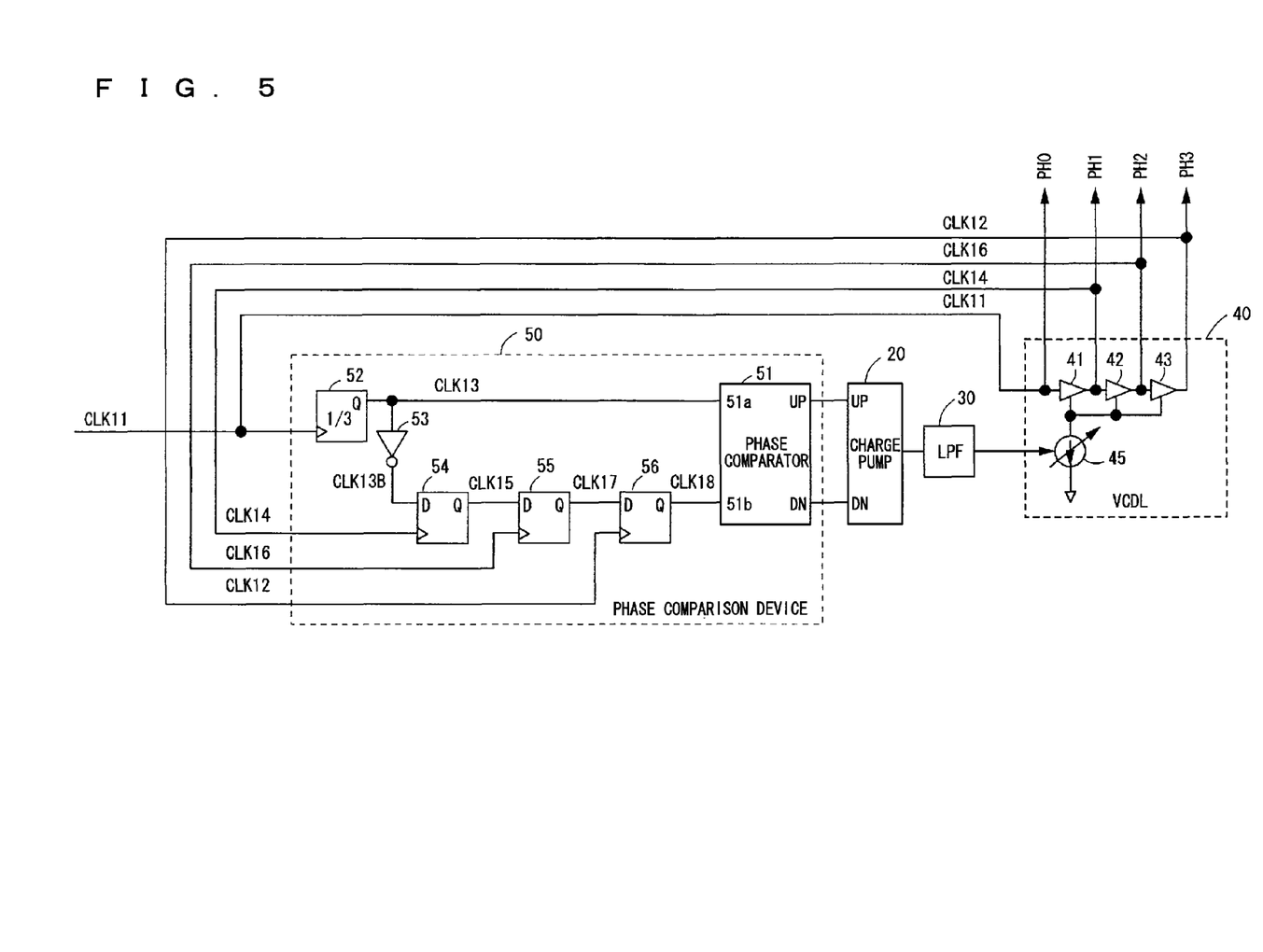
FIG. 5 is a circuit diagram of a DLL circuit in a second embodiment of the present invention.
Figure 6:
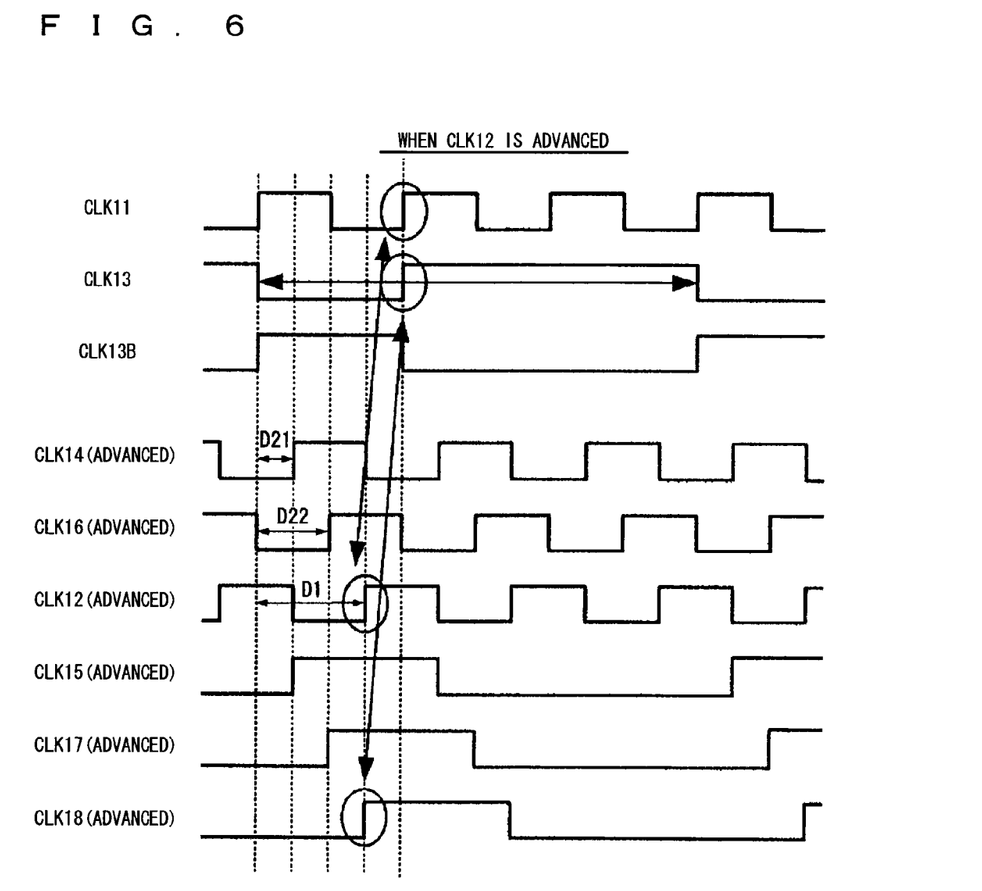
FIG. 6 is an operation waveform diagram at the time when the phase of the feedback clock CLK2 is advanced with respect to that of a reference clock CLK1 in the DLL circuit of FIG. 5.
Figure 7:
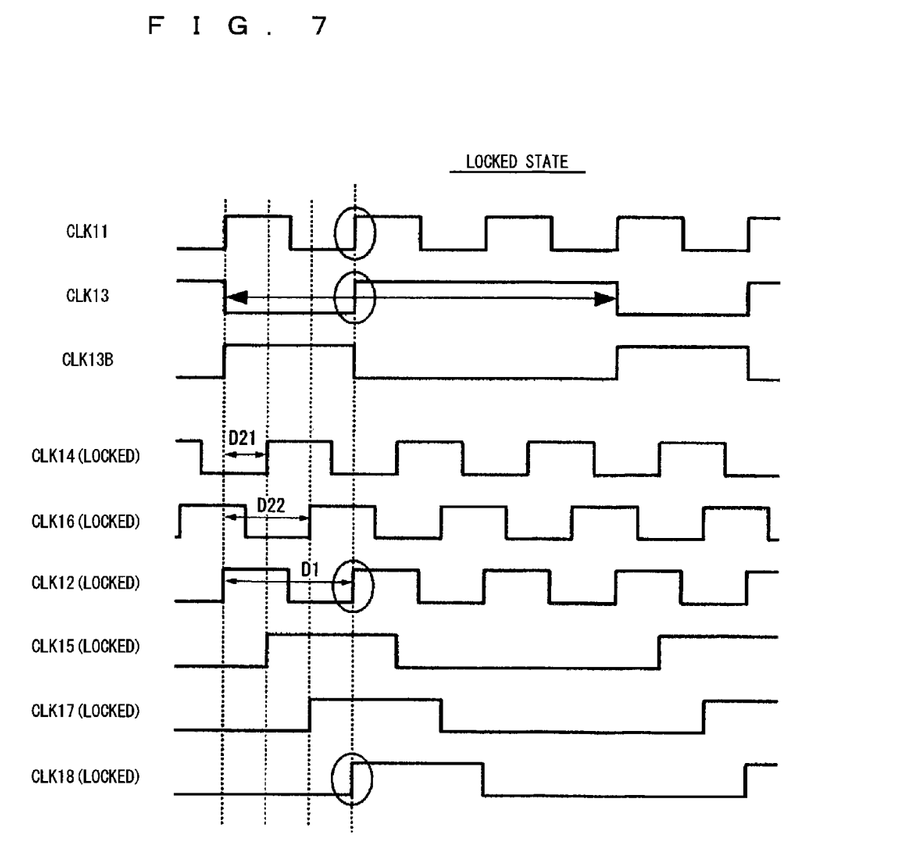
FIG. 7 is an operation waveform diagram at the time when the phase of the feedback clock CLK2 is the same as that of the reference clock CLK1 in the DLL circuit of FIG. 5.
Figure 8:
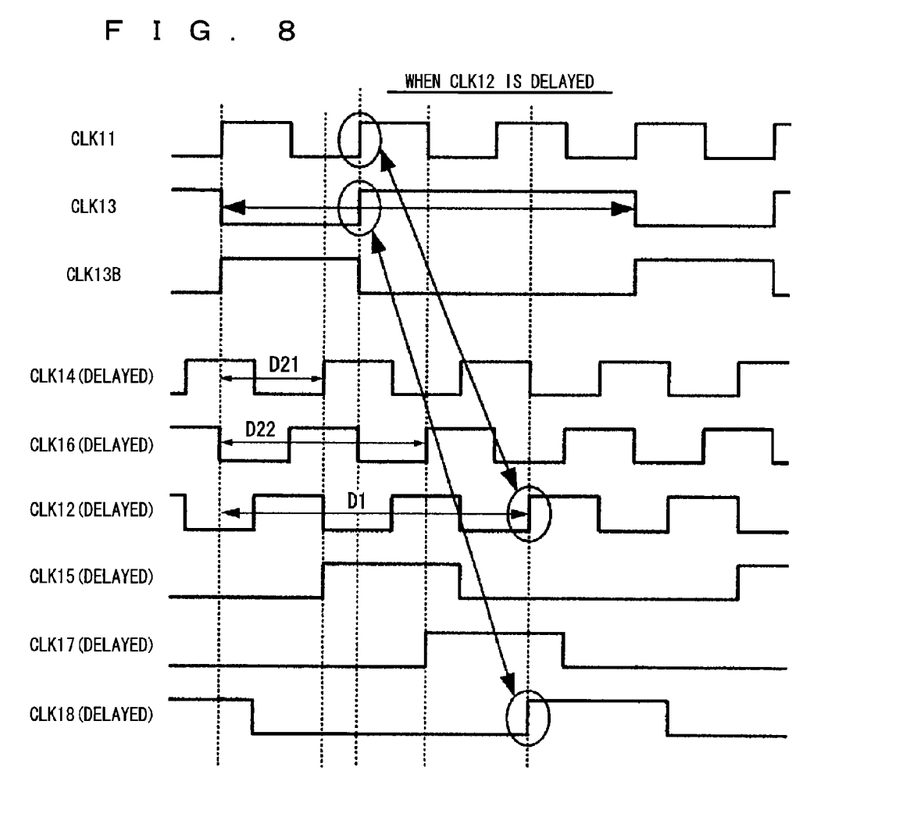
FIG. 8 is an operation waveform diagram at the time when the phase of the feedback clock CLK2 is delayed with respect to that of the reference clock CLK1 in the DLL circuit of FIG. 5.

FIG. 5 shows a DLL circuit which includes a phase comparison device 50 of a second embodiment and shows a DLL circuit for extending a phase detection range of a feedback clock CLK12 to the range of $-2\pi$ to $+2\pi$. Further, FIGS. 6 to 8 show operation wavelengths of the DLL circuit.

In the DLL circuit of the present embodiment, the phase comparator 11A described in FIG. 10 is replaced by the phase comparison device 50. This phase comparison device 50 includes: a divider 52 that divides a reference clock CLK11 by three (triple cycle); an inverter 53 that inverts a phase of a division clock CLK13 outputted from the divider 52 to generate a division inverted clock CLK13B; a DFF circuit 54 that synchronizes the division inverted clock CLK13B outputted from the inverter 53 with a delay clock PH1 (=CKL14) outputted from a delay element 41 of the variable delay buffer circuit 40; a DFF circuit 55 that re-synchronizes a synchronized clock CLK15 outputted from the DFF circuit 54 with a delay clock PH2 (=CLK16) outputted from the delay element 42; a DFF circuit 56 that finally synchronizes a re-synchronized clock CLK17 outputted from the DFF circuit 55 with a feedback clock CLK12; and a phase comparator 51 that inputs the division clock CLK13 into a reference signal input terminal 51a, and inputs a final synchronized clock CLK18 finally synchronized in the DFF circuit 56 into a feedback signal input terminal 51b. In addition, as for the relation with the claims, the DFF circuits 54, 55 constitute the first synchronizing means and the DFF circuit 56 constitutes the second synchronizing means.

Here, the phase comparator 51 compares phases of rising edges of clocks that are to be inputted into the two input terminals 51a, 51b. In this case, a divider 52 by division by three generates the clock CLK13 in which the "L" period is $2\pi$ and the "H" period is $4\pi$. In addition, in the case of using as the phase comparator 51a comparator that compares phases of falling edges of the clock CLK13 that is to be inputted into the input terminals 51a, 51b, a division circuit that generates the clock CLK13 in which the "H" period is $2\pi$ and the "L" period is $4\pi$ is used as the divider 52.

Also in the present embodiment, a similar consideration to that in the case of the embodiment of FIG. 1 is performed, thereby to enable setting of a range of a delay amount permitted for each delay clock. Alternatively, a plurality of delay clocks can also be generated by simple schematic division between the reference clock CLK11 and the feedback clock CLK12 into equal parts.

For example, when a delay amount of the feedback clock CLK12 from the reference clock CLK11 is D1 and a delay amount of the first delay clock from the reference clock CLK11 is D21 and a delay amount of the second delay clock from the reference clock CLK11 is D22, it is possible that $D21=(1/3)D1$ and $D22=(2/3)D1$. In this case, with the locked state regarded as a reference, it is possible to obtain a phase detection range to $2\pi$ on the − side and to nearly $3\pi$ on the + side.

Other Embodiments

Further, in order to extend the phase detection range of the feedback clock to a range of $-2\pi$ to $+2(N-1)\pi$ (N is a positive integer not smaller than two), a reference clock is divided by N (its cycle is multiplied by N) and then inputted into one input terminal of the phase comparator. A division inverted clock obtained by inverting the clock divided by N is synchronized N−1 times with the delay clocks in the number of N−1 whose delay amounts sequentially increases by $2\pi$ each at the maximum, and then synchronized with the feedback clock. Thereby, the final synchronized clock is obtained and then inputted into the other input terminal of the phase comparator.

Also here, in the case of using the phase comparator that compares phases of rising edges of the clocks that are to be inputted into the two input terminals, a clock in which the "L"

period is 2π and the "H" period is 2(N−1)π is generated as the division clock. In the case of using the phase comparator that compares phases of falling edges of the clocks that are to be inputted into the two input terminals, in which the "H" period is 2π and the "L" period is 2(N−1)π is generated as the division clock. Also in the case of division by three or division by N, the number of delay clocks can be made larger than N−1, to increase the operation margin.

EXPLANATION OF REFERENCE NUMERALS

10: phase comparison device, 11/11A: phase comparator, 12: divider by two, 13: inverter, 14/15: DFF circuit
20: charge pump
30: low-pass filter
40: variable delay buffer circuit, 41-44: delay element, 45: current source
50: phase comparison device, 51: phase comparator, 52: divider by three, 53: inverter, 54-56: DFF circuit

The invention claimed is:

1. A phase comparison device, which compares a phase of a first clock with a phase of a second clock having the same frequency as the first clock and delayed from the first clock just by a delay amount D1, the phase comparison device comprising:
   a divider that generates a division clock obtained by receiving said first clock and dividing the first clock by N, N being a positive integer not smaller than two;
   an inverter that inverts a phase of said division clock to generate a division inverted clock;
   a first synchronizing section to synchronize said division inverted clock sequentially with delay clocks in the number of m, m being a positive integer not smaller than N−1, to generate a synchronized clock, the delay clocks having the same frequencies as said first clock and whose delay amounts from said first clock increase by 2π each at the maximum within a range smaller than said delay amount D1 when one cycle of said first clock is regarded as 2π;
   a second synchronizing section to synchronize said synchronized clock with said second clock to generate a final synchronized clock; and
   a phase comparator that receives said division clock and said final synchronized clock to compare phases of the division clock and the final synchronized clock.

2. The phase comparison device according to claim 1, wherein
   said phase comparator compares phases of rising edges of said division clock and said final synchronized clock and said division clock has a logic low level period of 2π and a logic high level period of 2(N−1)π, or
   said phase comparator compares phases of falling edges of said division clock and said final synchronized clock and said division clock has a logic high level period of 2π and a logic low level period of 2(N−1)π.

3. The phase comparison device according to claim 1, wherein
   N=2 and m=1, and
   said first synchronizing section generates said synchronized clock by use of said delay clock whose delay amount from said first clock is D2 (0<D2<2π and D1−2π<D2).

4. The phase comparison device according to claim 3, wherein the delay amount D2 of said delay clock is 0.5D1.

5. A DLL circuit, comprising:
   the phase comparison device according to claim 1; and
   a variable delay buffer circuit that delays said first clock just by a delay amount controlled based upon a phase comparison result of said phase comparator, and outputs the clock as said second clock.

6. The DLL circuit according to claim 5, wherein
   said variable delay buffer circuit includes a plurality of delay buffers that are cascade-connected and whose delay amounts are mutually controlled based upon said phase comparison result; and
   said delay clocks in the number of m are clocks taken out from the respective output sides of the plurality of different delay buffers.

7. The DLL circuit according to claim 5, wherein said phase comparator outputs said phase comparison result which maintains the delay amount of said variable delay buffer circuit when D1=2π.

* * * * *